(12) United States Patent
Delp et al.

(10) Patent No.: US 8,484,608 B2
(45) Date of Patent: Jul. 9, 2013

(54) BASE PLATFORMS WITH COMBINED ASIC AND FPGA FEATURES AND PROCESS OF USING THE SAME

(75) Inventors: Gary S. Delp, Rochester, MN (US); George Wayne Nation, Rochester, MN (US)

(73) Assignee: LSI Corporation, Milpitas, CA (US)

(*) Notice: Subject to any disclaimer, the term of this patent is extended or adjusted under 35 U.S.C. 154(b) by 278 days.

(21) Appl. No.: 12/576,775

(22) Filed: Oct. 9, 2009

(65) Prior Publication Data
US 2010/0031222 A1    Feb. 4, 2010

Related U.S. Application Data

(62) Division of application No. 11/079,439, filed on Mar. 14, 2005, now Pat. No. 7,620,924.

(51) Int. Cl.
    *G06F 17/50*     (2006.01)
(52) U.S. Cl.
    USPC ........... 716/138; 716/116; 716/121; 716/128; 716/137
(58) Field of Classification Search
    USPC .............. 716/16–18, 116, 121, 128, 137–138
    See application file for complete search history.

(56) References Cited

U.S. PATENT DOCUMENTS

| | | | |
|---|---|---|---|
| 5,526,278 A * | 6/1996 | Powell | 716/16 |
| 5,978,260 A | 11/1999 | Trimberger et al. | |
| 6,744,274 B1 * | 6/2004 | Arnold et al. | 326/16 |
| 6,798,239 B2 * | 9/2004 | Douglass et al. | 326/39 |
| 6,857,110 B1 * | 2/2005 | Rupp et al. | 716/4 |
| 6,886,092 B1 * | 4/2005 | Douglass et al. | 712/37 |
| 6,944,836 B1 | 9/2005 | Lai | |
| 6,954,917 B2 | 10/2005 | How et al. | |
| 6,959,428 B2 | 10/2005 | Broberg, III et al. | |
| 6,966,044 B2 | 11/2005 | Reuland et al. | |
| 6,975,137 B1 | 12/2005 | Schadt et al. | |
| 7,062,744 B2 | 6/2006 | Osann, Jr. | |
| 7,093,225 B2 | 8/2006 | Osann | |
| 7,142,557 B2 | 11/2006 | Dhir et al. | |
| 7,216,323 B2 | 5/2007 | Dillon et al. | |
| 7,222,324 B1 | 5/2007 | Kaszynski | |
| 7,228,521 B1 | 6/2007 | Ma et al. | |
| 7,239,173 B1 | 7/2007 | Voogel | |

(Continued)

OTHER PUBLICATIONS

Andrew, William B. et al.; "A Field Programmable System Chip which Combines FPGA & ASIC Circuitry"; IEEE Custom Integrated Circuits Conference; 1999; pp. 183-186.*

(Continued)

*Primary Examiner* — Naum Levin
(74) *Attorney, Agent, or Firm* — Alan G. Rego; Westman, Champlin & Kelly, P.A.

(57) ABSTRACT

A process is disclosed for configuring a base platform having ASIC and FPGA modules to perform a plurality of functions. A verified RTL hardware description of a circuit is mapped and annotated to identify memory programmable functions. The memory programmable functions are grouped for assignment to FPGA modules. The non-memory programmable functions are synthesized to ASIC modules, and the memory programmable functions are synthesized to FPGA modules. Placement, signal routing and boundary timing closure are completed and the platform is configured by adding metallization layer(s) to configure the ASIC modules and creating a firmware memory to configure the FPGA modules. An over-provisioning feature in the FPGA modules permits post-fabrication alteration of logic functions.

9 Claims, 3 Drawing Sheets

U.S. PATENT DOCUMENTS

| | | | |
|---|---|---|---|
| 7,243,329 | B2 | 7/2007 | Chua et al. |
| 7,251,804 | B1 | 7/2007 | Trimberger |
| 7,257,799 | B2 | 8/2007 | McKenney et al. |
| 7,284,226 | B1 | 10/2007 | Kondapalli |
| 7,313,730 | B1 | 12/2007 | Ryser |
| 7,650,545 | B1 | 1/2010 | Abramovici et al. |
| 7,743,085 | B2 * | 6/2010 | Schmit et al. ............ 708/710 |
| 2001/0034876 | A1 * | 10/2001 | Panchul et al. ............ 716/18 |
| 2002/0026539 | A1 | 2/2002 | Muthukumaraswamy et al. |
| 2002/0066956 | A1 | 6/2002 | Taguchi |
| 2002/0122386 | A1 | 9/2002 | Calvignac et al. |
| 2003/0062922 | A1 | 4/2003 | Douglass et al. |
| 2003/0110339 | A1 | 6/2003 | Calvignac et al. |
| 2003/0110463 | A1 * | 6/2003 | Kuhlmann et al. ........ 716/17 |
| 2003/0237071 | A1 * | 12/2003 | Lee et al. ............ 716/16 |
| 2004/0004239 | A1 * | 1/2004 | Madurawe ............ 257/298 |
| 2004/0073882 | A1 * | 4/2004 | Osann, Jr. ............ 716/16 |
| 2004/0178819 | A1 * | 9/2004 | New ............ 326/40 |
| 2005/0040850 | A1 * | 2/2005 | Schultz et al. ............ 326/41 |
| 2005/0257177 | A1 * | 11/2005 | Chen et al. ............ 716/1 |
| 2006/0190903 | A1 * | 8/2006 | Koo ............ 716/16 |
| 2006/0236270 | A1 * | 10/2006 | Delp et al. ............ 716/1 |
| 2006/0236292 | A1 * | 10/2006 | Delp et al. ............ 716/16 |
| 2006/0248493 | A1 * | 11/2006 | Osann, Jr. ............ 716/16 |
| 2007/0245270 | A1 * | 10/2007 | Teig ............ 716/1 |
| 2008/0150579 | A1 * | 6/2008 | Madurawe ............ 326/38 |

OTHER PUBLICATIONS

Dave Bursky, "Platforms Get Extreme for Storage, High-Speed I/O", Electronic Design, Nov. 29, 2004 www.elecdesign.com.

Roger Allan "SiP Really Packs It in", Electronic Design, Nov. 29, 2004 www.elecdesign.com.

Election/Restriction Requirement from the United States Patent and Trademark Office for U.S. Appl. No. 11/079,439, dated Dec. 29, 2006.

Office Action from the United States Patent and Trademark Office for U.S. Appl. No. 11/079,439, dated Jul. 10, 2007.

Final Office Action from the United States Patent and Trademark Office for U.S. Appl. No. 11/079,439, dated Dec. 21, 2007.

Office Action dated from the United States Patent and Trademark Office for U.S. Appl. No. 11/079,439, dated Mar. 17, 2008.

Final Office Action from the United States Patent and Trademark Office for U.S. Appl. No. 11/079,439, dated Dec. 24, 2008.

Advisory Action from the United States Patent and Trademark Office for U.S. Appl. No. 11/079,439, dated Apr. 3, 2009.

Notice of Allowance from the United States Patent and Trademark Office for U.S. Appl. No. 11/079,439, dated Jul. 9, 2009.

* cited by examiner

BASE PLATFORMS WITH COMBINED ASIC AND FPGA FEATURES AND PROCESS OF USING THE SAME

CROSS REFERENCE TO RELATED APPLICATION

The present application is a divisional of and claims priority from U.S. patent application Ser. No. 11/079,439, filed Mar. 14, 2005, now U.S. Pat. No. 7,620,924, the content of which is hereby incorporated by reference in its entirety.

FIELD OF THE INVENTION

This invention concerns integrated circuits (ICs), and particularly to configurable base platforms having both application-specific IC (ASIC) and field-programmable gate array (FPGA) features.

BACKGROUND OF THE INVENTION

Reference is made to U.S. Pat. No. 7,491,579, filed on even date herewith by Gary S. Delp and George Wayne Nation for "Composable System-in-Package Integrated Circuits and Process of Composing the Same" and assigned to the same assignee as the present invention, the content of which is hereby incorporated by reference in its entirety. The Delp et al. application describes use of configurable base platforms in a system-in-package (SIP).

Conventional ICs had been fabricated by foundries according to designs from device manufacturers. The design process required extensive design and development procedures for placement of elements, signal routing and timing to achieve correct operation of the IC.

More recently, configurable base platforms have become widely used as efficient and economic alternatives to traditional ICs. Configurable base platforms are characterized by a transistor fabric and at least some standard modules that are configurable by the addition of metallization layers or firmware into a functional device. Usually, the configurable base platform included a transistor fabric which is configured to implement a device manufacturer's (customer's) unique circuits, called "customer intellectual property" or simply "customer IP." In the aforementioned Delp et al. application, we describe use of a configurable base platform that does not have many of the standard modules, such as large memory, input/output (I/O) modules, processors, etc. Instead, standard die provide these standard functions, and the die and platform are packaged together as a SIP.

The present invention is directed to a base platform that includes both ASIC and FPGA features, and to a process of configuring the platform to a usable device. The hybrid platform thus provides the advantage of the speed of ASICs and the ease of expansion and modification of FPGAs. While combined ASIC and FPGA packages are known, there is a need for a configurable base platform with ASIC and FPGA features and a process that allows customer to configure both the ASIC and FPGA features of such base platforms.

SUMMARY

In one embodiment, a process is provided for designing a base integrated circuit platform having ASIC and FPGA modules to perform memory programmable functions and non-memory programmable functions. The process includes: a) preparing a verified hardware description of a circuit to be embodied in the platform; b) grouping the memory programmable functions for assignment to FPGA modules; c) selecting a base platform design containing ASIC and FPGA modules adequate to execute the plurality of functions; and d) synthesizing the non-memory programmable functions to ASIC modules and the memory programmable functions to FPGA modules.

The platform is configured, for example, by adding a metallization layer to configure the ASIC modules and creating a firmware memory image to configure the FPGA modules.

In another embodiment, a hybrid platform containing ASIC and FPGA features is provided.

In another embodiment, the platform is over-provided with FPGA features, and a controller is operable to selectively substitute functions performed in or controlled by the FPGA modules for logic functions in the ASIC modules, thereby permitting post-fabrication modification of the functions of the platform without re-working the platform design.

In another embodiment, a process is provided. The process includes: a) preparing a hardware description of a circuit; b) selecting a base integrated circuit platform having pre-diffused metal-programmable transistor fabric and firmware-configurable logic blocks, which are suitable for embodying functions of the hardware description; c) grouping memory programmable functions of the hardware description for assignment to the firmware-configurable logic blocks; and d) synthesizing non-memory programmable functions to the pre-diffused metal-programmable transistor fabric and the memory programmable functions to the firmware-configurable logic blocks.

DETAILED DESCRIPTION OF THE PREFERRED EMBODIMENTS

In one form, base platforms according to the present invention include hardmacs composed of embedded transistors and other electronic circuit elements diffused into the semiconductor layers of the base platform and configured as memories, transceivers, arithmetic processors, analog-to-digital (A/D) and digital-to-analog (D/A) converters, I/O, etc. Arrays of pre-diffused transistors, sometimes called the "transistor fabric," are arranged in a grid pattern to support user-defined memory and logic. The base platforms also include configurable logic blocks (CLBs) that are programmable by firmware loaded into configuration memories on the platform. The aforementioned Delp et al. application describes an exemplary process of fabricating a base platform in which a wafer is diced into individual die or platforms.

In another form, the hardmacs are not included on the base platform. Instead, the base platform is composed of the transistor fabric to support user-defined memory and logic, CLBs and memory to support the platform. Separate die are configured as memories, transceivers, processors, converters, I/O, firmware memory, etc. to support the configured platform as described in the aforementioned Delp et al. application.

In use, the device manufacturer employs tools known and practiced in the industry to design the metallization layer(s) to configure the transistor fabric into logic and memory functions and to design firmware for a configuration memory to configure the CLBs into FPGA functions. In a version of the base platform that includes hardmacs, the metallization layer(s) also interconnect the circuit elements to configure the hardmacs into operable relation.

Figure 1:
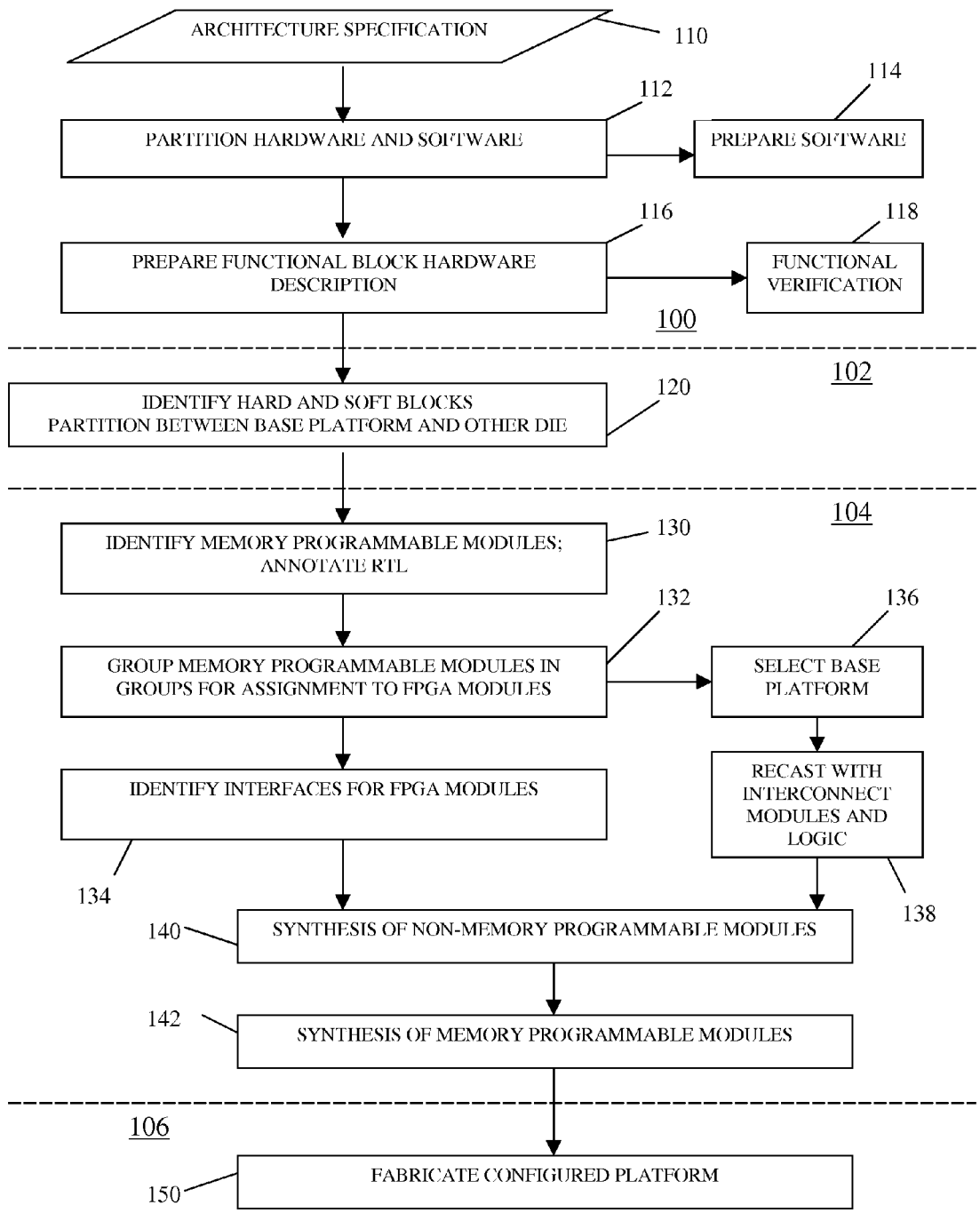
FIG. 1 is a flowchart of a process of configuring the base platform for both ASIC and FPGA features.

A process of configuring the base platform for both ASIC and FPGA features is presented in FIG. 1. The process is segmented into four sections. Section 100 defines the steps taken by the user (device designer) to create a Hardware Description Language (HDL) description of an IC to be fabricated from a base platform according to the present invention. Section 102 describes a process of partitioning the hardware components into the die and base platforms where the base platforms that do not include hardmac functions (i.e., the platform will be part of an SIP that includes separate die containing the hardmacs). At section 104 the physical design of the base platform is created, and at section 106 the configured platform is fabricated.

At step 110 a functional specification is created for the platform or SIP to be fabricated. At step 112, the functions are separated into hardware and software functions. Firmware for programming the CLBs is abstracted out of the specification at this time. Software is separately developed at step 114. At step 116, functional blocks of hardware are defined in a hardware description language, such as a Verilog Register Transfer Level (RTL) description. The RTL description is verified at step 118, and the functional blocks are modified until a satisfactory design is achieved.

Upon completion of a verified RTL description of the hardware design, the process continues to section 102 to partition of the hardware components between the base platform and die for an SIP, or to section 104 for a complete platform. It is not always necessary to complete verification of the RTL design before entering section 102. However, subsequent changes to the HDL description due to errors found in verification step 118 will cause interruptions to the design steps of 102, 104, and 106. Even with these possible interruptions, proceeding with design implementation before completing verification is a common practice.

In the case of an SIP, optional step 120 sets forth the procedure of separating the hardware functions into hard and soft functions for the platforms and die of an SIP as described in the aforementioned Delp et al. application. A hard function is one that can be executed by a standard circuit die from the foundry's standard die library, while a soft function is one requiring user-defined logic or memory in a platform. Each hard function is assigned to a standard die, called a "sidecar," selected from the foundry's die library and capable of executing the function. Firmware is fixed (loaded) into at least one of the memory die for the FPGA functions in a manner well known in the art.

In section 104, the platform design from section 100 (for a single IC) or section 102 (for an SIP), is supplied to step 130. At step 130, a module map of the hardware for the platform is created and the RTL is annotated with identification of the target logic type, such as ASIC or FPGA. The memory programmable modules are grouped at step 132 for assignment to one or more CLBs in the base platform. Preferably, the die and platform are selected with excess function (excess memory, logic, etc.) to over-provide the platform and die with elements for future expansion. More particularly, the size of the memory programmable modules may be enlarged for additional signal capabilities so that the memory-programmable functions can be expanded for additional signals in future versions of the circuit. Anticipating and identifying these signals is done is step 132.

At step 134, interfaces for the FPGA modules are defined. More particularly, the power and signal paths for the FPGA modules are defined, and if the platform is one for a SIP, interfaces between the die and platform are defined as described in the aforementioned Delp et al. application. At step 136, a base platform is selected with adequate CLB, optional hardmacs and transistor fabric to support the FPGA and ASIC functions for the IC or SIP. In some embodiments more fully described in conjunction with FIGS. 3 and 4, the selected base platform is overprovided with CLB and interface control to permit future substitution of logic initially formed in the transistor fabric with programmed logic in the FPGA fabric.

If the platform does not include hardmacs, as for a SIP, at step 138 the platform is recast with interconnect modules and logic substituted for sidecar die as described in the aforementioned Delp et al. application. Otherwise the process proceeds directly to step 140. At step 140 the non-memory programmable (metal-configured) modules are synthesized and placement and time closure is performed for the boundary nets. At step 142, the memory programmable (CLB) modules are synthesized, and placement and timing closure is completed for the entire platform.

The process ends with step 150 and fabrication of the configured platform with the firmware loaded into memory. The memory is a configuration memory that is either on platform (for an IC), in a separate die (in the case of a SIP), or in an off-platform configuration controller for either case. In either case, the memory containing the firmware is a configuration memory that configures the CLBs for the FPGA.

The platform is then assembled into a flipchip or wirebond for a SIP, as described in the aforementioned Delp et al. application, or packaged for assembly into an electronic device by the device manufacturer.

Figure 3:
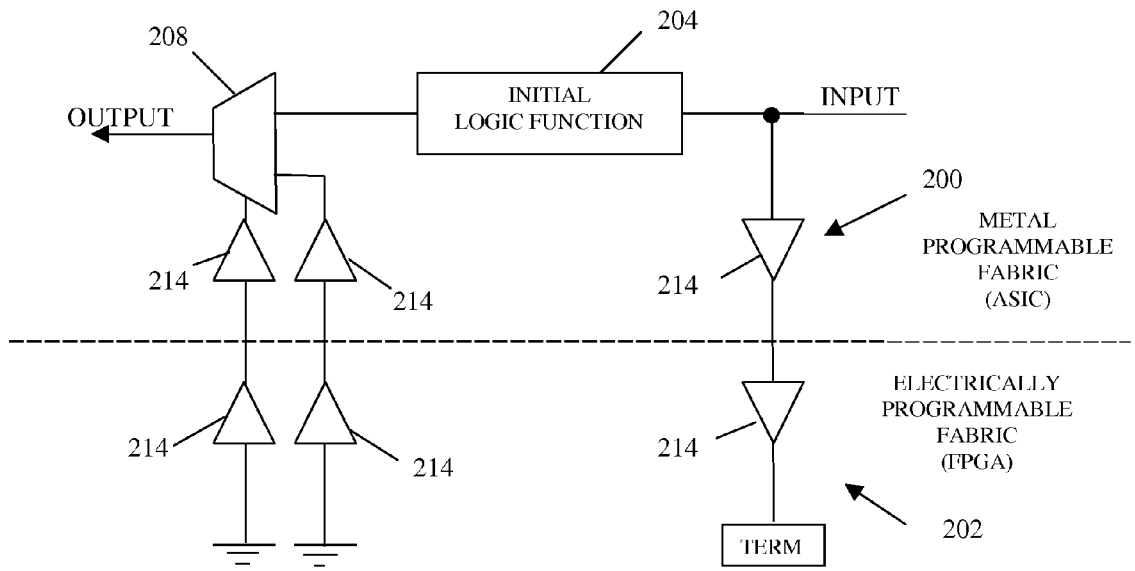
FIGS. 3 and 4 are diagrams illustrating an overprovisioning feature to permit substitution of an updated logic function in FPGA for an initial logic function in ASIC.
Figure 4:
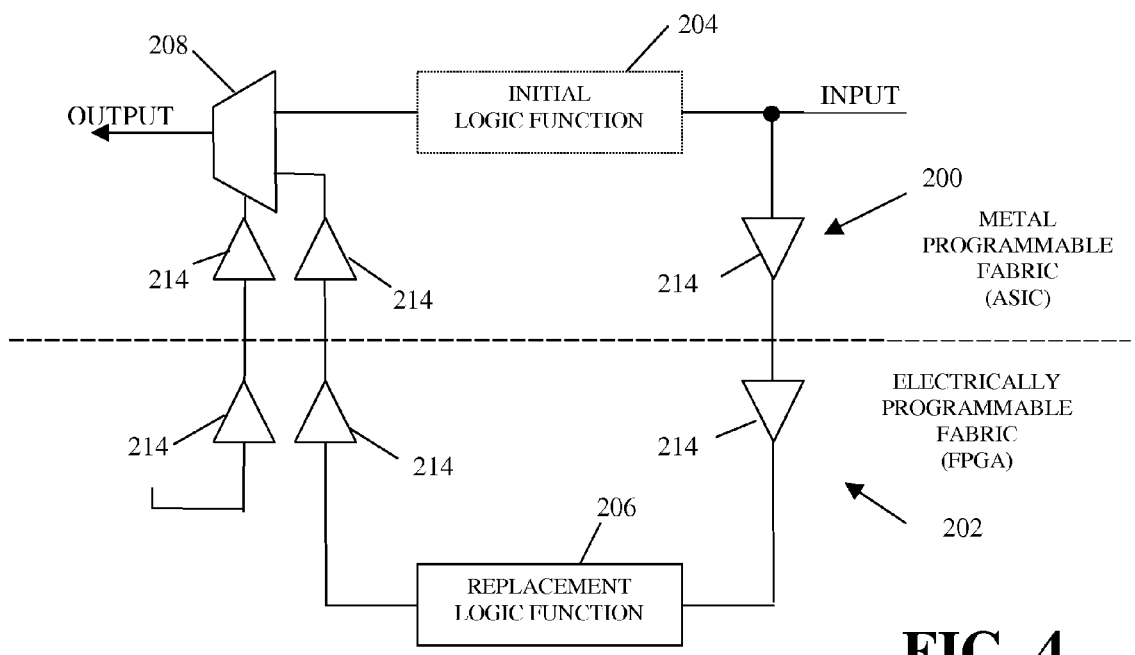

FIGS. 3 and 4 are diagrams illustrating an over-provisioning of programmable logic (CLBs) and FPGA signal interfaces to bypass initial logic formed in the transistor logic. The feature is particularly useful for upgraded and improved circuits and permits future addition and substitution of logic functions without re-fabricating the platform.

Figure 2:
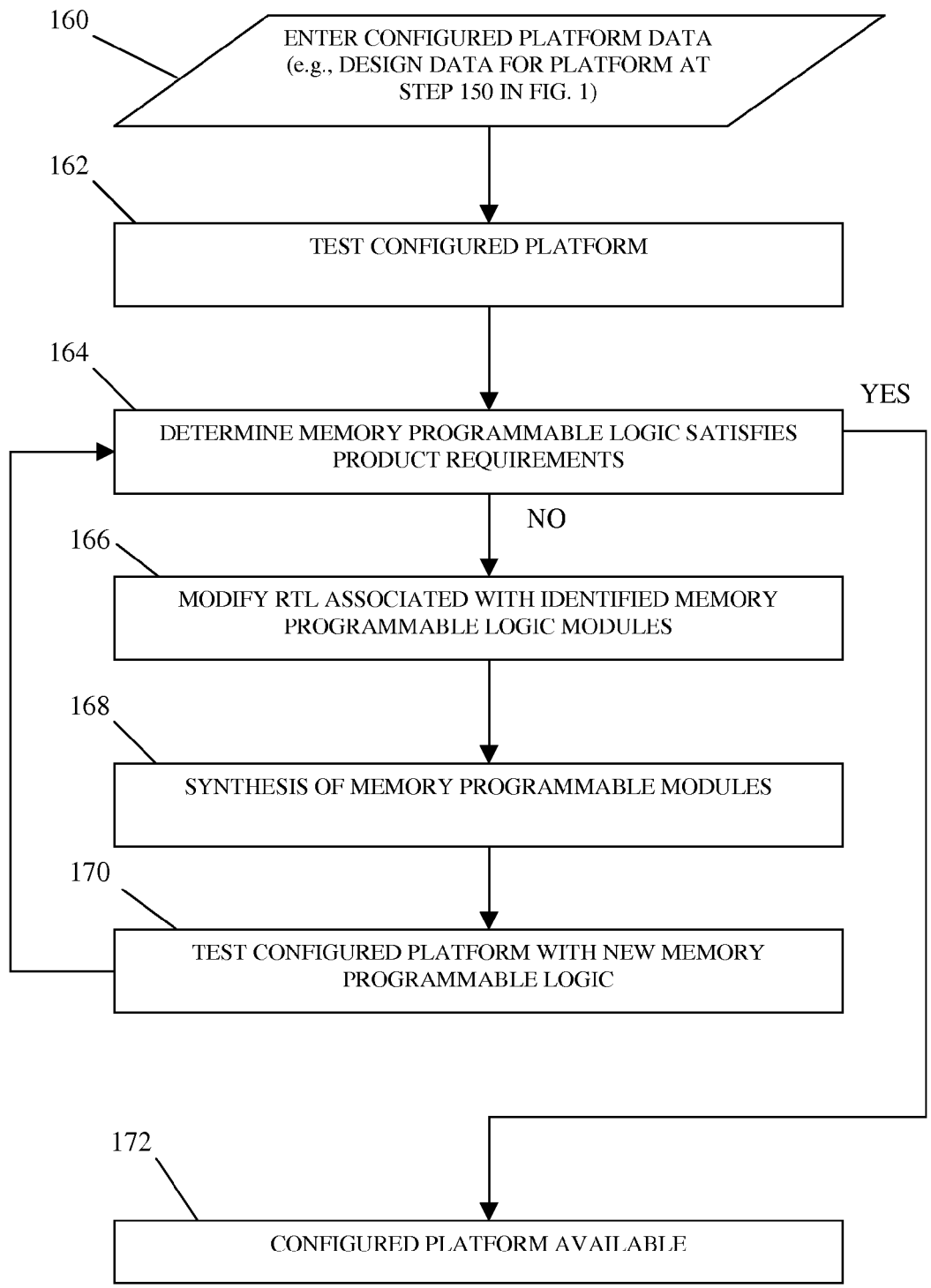
FIG. 2 is a flowchart of a process of testing and modifying a configured base platform.

FIG. 2 illustrates a process of testing and modifying a platform configuration according to an embodiment of the present invention. Ordinarily, the process of FIG. 2 is used in conjunction with the process of FIG. 1. The process begins with a configured platform design at step 160. The platform is tested at step 162 to determine if the memory programmable logic (e.g., FPGA functions) satisfies the specifications for the IC. More particularly, tests are performed on the platform to identify conformance to the specifications input at step 110 (FIG. 1). If all of the memory programmable logic conforms to the product specifications, as identified at step 164, then the process ends at step 172 identifying that the configured platform is available for use.

If, at step 164 some memory programmable logic is not in conformance to the specifications, then at step 166 the RTL that was annotated at step 130 (FIG. 1) for the memory programmable logic modules that are not in conformance with the specifications is identified for modification. More particularly, the RTL description to be modified is identified by the annotations corresponding to the modules requiring modification. Modification of the RTL attempts to bring the module into specification requirements in a manner well known in the art.

At step 168 the modules that were modified at step 166 are synthesized, and placement and timing closure is completed for the entire platform, as at step 142 in FIG. 1. It will be appreciated that the re-synthesis is applied only to the modules modified at step 166, but the placement and timing closure is performed for the entire platform. The configured platform design is tested at step 170, such as by repeating step 162 on the entire design. Steps 164-170 are iteratively repeated until a satisfactory design id identified at step 164, whereupon the process ends at step 172.

FIG. 3 illustrates a portion of a base platform having a configured metal programmed fabric (ASIC) 200 and electrically programmable fabric (FPGA) 202 containing dormant logic blocks, such as CLBs. The CLBs are dormant in the sense that they are not yet programmed to execute any given logic function. Thus, in FIG. 3, the metal programmable fabric, such as the transistor fabric, has been configured into initial logic and memory functions by one or more metal layers. Thus, a metal programmed logic block 204 has been hardwired in the transistor fabric by the interconnection by the metal layer(s).

Multiplexer 208 is coupled to logic 204 to output the results of execution of the logic function of logic 204 on input data. Multiplexer has a second input 212 and an enable input 210, coupled to the FPGA module through buffers 214 on both modules. More particularly, with logic 204 operatively executing logic functions on input data, enable 210 and input 212 are fixed to a low logic level. Input data are applied to logic 204 and to a termination block 216 in FPGA module 202, such as through buffers 214.

Initially, the circuit operates with logic 204 hardwired in the transistor fabric by the metal interconnect layer(s). Input data are input to logic 204 to perform logic functions on the input data and provide a result to multiplexer 208. A fixed logically low enable input 210 to multiplexer 208 operates the multiplexer to output the result from logic 204.

Should it become necessary or desirable to update or change the logic function performed on the input data by logic 204, CLBs in the electronically programmable fabric 202 are programmed by firmware in a configuration memory to configure a new or replacement logic function 206 in the electronically programmable fabric. Input data are input to logic 206 instead of termination block 216, and the results of the logic function are output to input 212 of multiplexer 208. The enable input 210 of multiplexer 208 is fixed to a high logical level so that multiplexer provides an output of the results of logic 206 in place of logic 204. Thus, using firmware in a configuration memory, logic 206 can be configured to perform a new logic function which can be substituted into the circuit in place of logic 204, without altering the physical properties of the platform. Thus, a device manufacturer might define new or changed logic functions for a next-generation circuit, and, with a base platform according to the present invention, program the new or changed logic function into logic 206. This feature is particularly useful for upgrading the device manufacturer's circuit without physically altering the platform.

While the over-provisioning feature is described in conjunction with substituting an FPGA function for an ASIC function, the concept may also be applied to couple off-chip functions, such as logic, memory, processing, I/O, etc. through the FPGA module. More particularly, input data may be supplied to and processed by an off-chip device. The result is then returned to logic 206 for gating through multiplexer 208.

The over-provisioning of FPGA signal interfaces with data and control signals is sufficient to control the bypass of ASIC control logic and functional replacement by a post-design update of the control logic in FPGA. Initially, the FPGA modules are dormant, except for logic for isolating the over-provisioned signal paths and supporting circuitry e.g., multiplexer 208. Datapath signals to and from the ASIC modules permit the ASIC modules to execute functions for the circuit in a first or initial configuration of the platform. Later addition or modification of firmware in the configuration memory, which is preferably in an off-chip controller, updates the dormant FPGA modules to process data to perform some new or updated function in place of the function performed by the bypassed ASIC module, without physical modification of the platform.

The present invention thus provides a hybrid base platform containing both ASIC and FPGA features and a process of configuring the platform into a functional IC as an independent IC or for use in a SIP.

Although the present invention has been described with reference to preferred embodiments, workers skilled in the art will recognize that changes may be made in form and detail without departing from the spirit and scope of the invention.

The invention claimed is:

1. A process comprising steps of:
 a) preparing a verified hardware description of a circuit to be embodied in a base integrated circuit platform and a separate die, wherein the base integrated circuit platform includes a single die that has both ASIC and FPGA modules, wherein the verified hardware description of the circuit comprises a plurality of functions, wherein the separate die is outside of the base integrated circuit platform;
 b) separating the plurality of functions into standard functions and user-defined functions, wherein the user-defined functions comprise memory programmable functions and non-memory programmable functions;
 c) assigning the standard functions to the separate die and the user-defined functions to the single die of the base integrated circuit platform;
 d) for the user-defined functions, grouping the memory programmable functions for assignment to FPGA modules on the single die of the base integrated circuit platform;
 e) for the user-defined functions, synthesizing the non-memory programmable functions to the ASIC modules and the grouped memory programmable functions to the FPGA modules on the single die of the base integrated circuit platform;
 f) configuring the single die of the base integrated circuit platform by adding at least one metallization layer to configure the ASIC modules, and creating a configuration memory image to configure the FPGA modules; and
 g) packaging the separate die with the single die of the configured base integrated circuit platform to form a system-in-package.

2. The process of claim 1, further including, before step d), a step of: identifying the memory programmable functions.

3. The process of claim 2, wherein step d) comprises steps of
 annotating a module map of the hardware description to identify the memory programmable functions, and
 grouping the memory programmable functions for assignment to FPGA modules based on the annotated module map.

4. The process of claim 1, wherein step d) comprises steps of:
 annotating a module map of the hardware description to identify the memory programmable functions, and
 grouping the memory programmable functions for assignment to FPGA modules based on the annotated module map.

5. The process of claim 1, further comprising:
programming at least one FPGA module of the FPGA modules with a memory programmable function to replace a non-memory programmable function assigned to at least one ASIC module of the ASIC modules, and
controlling outputs from the at least one FPGA module and the at least one ASIC module to output results from the at least one FPGA module in place of results from the at least one ASIC module.

6. The process of claim 5, wherein controlling comprises:
applying input signals to the at least one FPGA module, which are connected to the at least one ASIC module for which the non-memory programmable function is being replaced by the memory-programmable function of the at least one FPGA module; and
controlling a multiplexer, which is connected to outputs from the at least one FPGA module and the at least one ASIC module to output results from the at least one FPGA module in place of results from the at least one ASIC module.

7. The process of claim 1, further including steps of:
testing the synthesized FPGA modules to identify conformance to a specification for which the hardware description was prepared,
modifying the memory programmable functions for FPGA modules that are not in conformance to the specification, and
re-synthesizing the modified memory programmable functions to FPGA modules.

8. A process comprising:
a) preparing a hardware description of a circuit to perform a plurality of functions;
b) separating the plurality of functions into standard functions and user-defined functions, wherein the user-defined functions comprise memory programmable functions and non-memory programmable functions;
c) selecting a base integrated circuit platform comprising a single die having pre-diffused metal-programmable transistor fabric and firmware-configurable logic blocks, which are suitable for embodying the user-defined functions of the hardware description;
d) assigning the standard functions to a separate die outside of the base integrated circuit platform and the user-defined functions to the single die of the base integrated circuit platform;
e) for the user-defined functions, grouping memory programmable functions for assignment to the firmware-configurable logic blocks on the single die of the base integrated circuit platform;
f) for the user-defined functions, synthesizing the non-memory programmable functions to the pre-diffused metal-programmable transistor fabric and the grouped memory programmable functions to the firmware-configurable logic blocks on the single die of the base integrated circuit platform;
g) configuring the single die of the base integrated circuit platform by adding at least one metallization layer to configure the pre-diffused metal-programmable transistor fabric, and creating a configuration memory image to configure the firmware-configurable logic blocks; and
h) packaging the separate die with the single die of the configured base integrated circuit platform to form a system-in-package.

9. The process of claim 8, wherein synthesizing comprises:
selectively connecting at least one of the firmware-configurable logic blocks to the metal-programmable transistor fabric to receive input signals that are connected to logic configured in the metal-programmable transistor fabric; and
coupling a multiplexer to the logic configured in the metal-programmable transistor fabric and the at least one firmware-configurable logic block such that the multiplexer is configured to selectively output results from either the logic configured in the metal-programmable transistor fabric or the at least one firmware-configurable logic block.

* * * * *